United States Patent [19]
Pickering et al.

[11] Patent Number: 6,005,448
[45] Date of Patent: Dec. 21, 1999

[54] PHASE-TUNED RING OSCILLATOR

[75] Inventors: Andrew James Pickering, Rugby; Ian Charles Wood, Towcester, both of United Kingdom

[73] Assignee: Phoenix Vlsi Consultants, Ltd., Towcester, United Kingdom

[21] Appl. No.: 08/926,677

[22] Filed: Sep. 10, 1997

[30] Foreign Application Priority Data

Sep. 10, 1996 [GB] United Kingdom .................. 9618901

[51] Int. Cl.$^6$ ...................................... H03B 5/24
[52] U.S. Cl. .......................... 331/57; 331/34; 331/177 R; 327/280
[58] Field of Search ........................ 331/34, 57, 177 R, 331/179, DIG. 3; 327/270, 274, 276, 280

[56] References Cited

U.S. PATENT DOCUMENTS 5,475,344 12/1995 Maneatis et al. ......................... 331/57
5,841,325 11/1998 Knotts et al. ............................ 331/57

*Primary Examiner*—David Mis
*Attorney, Agent, or Firm*—Watson Cole Grindle Watson P.L.L.C.

[57] ABSTRACT

A ring oscillator comprises a ring of delay stages in which the output of each stage is input to the next stage in the ring. Tuning of the oscillation frequency of the oscillator is achieved by additionally taking outputs from delay stages elsewhere in the ring as one or two secondary inputs to each delay stage and mixing this or these in variable proportions with the primary input.

10 Claims, 4 Drawing Sheets

PHASE-TUNED RING OSCILLATOR

The present invention relates to oscillators, in particular to a form of ring oscillator, the frequency of which can be tuned by a control input.

The ring oscillator is a known circuit which is composed of a number of delay elements arranged in a series ring, with an odd number of signal inversions in the loop. In operation, a switching transient propagates continuously around the loop, thereby producing an oscillation. Because of the circular symmetry of the loop (assuming all the delay stages are identical), the phases of the outputs of each ring stage are equally spaced (with a total phase shift of 180° around the loop), and the oscillation period is given by twice the total of the delays around the loop. Ring oscillator circuits are widely used, for instance to measure the speed performance of integrated circuit fabrication processes.

Ring oscillators have many attractive features for implementing a fully-integrated oscillator: they are very easy to understand and design, and are capable of operating at very high frequencies; designs are relatively easily transportable between technologies, and they intrinsically provide multiple outputs at well-defined evenly-spaced phase intervals (an essential feature for some applications).

One way to produce a tunable ring oscillator is to include in the ring an amplifier stage (e.g. differential pair) whose delay may be altered. This can be achieved by changing the drive current in the gain stage. However, if a simple resistive load is used in the amplifier stage, this results in an output signal amplitude variation which cancels out the speed adjustment. One solution to this is to use a compensated load whose impedance is adjusted with the drive current to maintain constant voltage swing. However, this usually forces the use of lower drive currents and consequently limits the frequency that may be achieved.

EP-A-0294203 discloses a high speed voltage controlled ring oscillator which, in its simplest embodiment, comprises a number of inverting delay elements. These are arranged in a loop, with one portion of the loop comprising alternative signal paths having different amounts of delay in them. A mixing element mixes the outputs from these two path portions in varying proportions according to a control input to enable the frequency of the ring to be tuned between two limiting frequencies defined by the two alternative paths around the ring. In such an arrangement, the phase relationships between the outputs of the various delay stages around the ring are not maintained and therefore it is not possible to derive from this circuit a plurality of equally spaced oscillating outputs, and also this places a limitation on the amount of tuning which can be achieved.

Hence, the main difficulty with implementing conventional tunable ring oscillators is the achievement of reliable operation over a wide tuning range whilst maintaining high speed performance.

SUMMARY OF THE INVENTION

The present invention provides a tunable ring oscillator which comprises a number of delay stages arranged in a ring with an odd number of signal inversions in the ring, each stage having input to it the output of the previous stage and the output of another stage in the ring. The two inputs thus have phases different from each other, and tuning is achieved by mixing the two inputs in variable proportions such that the phase of the stage output is adjusted. This affects the frequency at which the circuit oscillates. The fact that the phase is adjusted at the input to each stage means that the phase relationships between the outputs of the stages can be maintained at the different frequencies.

Preferably the ring is symmetrical, that is each stage in the ring is configured in the same manner, with the exception of necessary signal inversions, and a single tuning input is applied to the mixing devices of all the stages. In this arrangement the plurality of equi-space signals can be derived from the ring in exactly the same manner as in the prior art described above, but now at tunable frequencies.

This invention thus uses a tuning technique that is fundamentally different to simple current tuning. The oscillation frequencies that can be achieved may be greater than or less than the frequency of the equivalent untuned ring oscillator.

BRIEF DESCRIPTION OF THE INVENTION

The present invention will be better understood from the following description of preferred embodiments given by way of example and with reference to the accompanying drawings, in which.

DESCRIPTION OF THE INVENTION

An important feature of the Phase-Tuned Ring Oscillator (PTRO) illustrated in the Figures. is the presence of a mixer at each stage input. This is used to combine a secondary phase-shifted signal (tapped off from a different ring stage) with the main stage input signal. As a result, the phase of the net stage input is modulated. This effectively forces the ring oscillation to shift in frequency in order to maintain the fixed relationship between the stage phases (which is defined by the ring configuration). Frequency tuning is achieved by varying the magnitude of the secondary signal input to the mixer, and hence the degree of phase-shifting.

Figure 1:
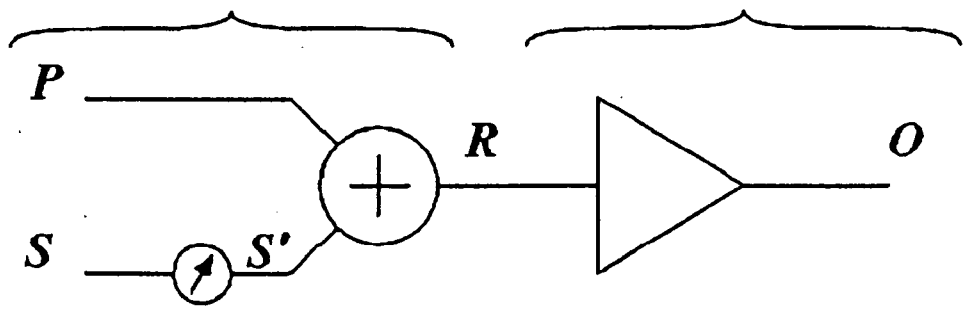
FIG. 1 shows an equivalent circuit of one stage of the oscillator of the preferred embodiment and a related phasor diagram.
Figure 1:
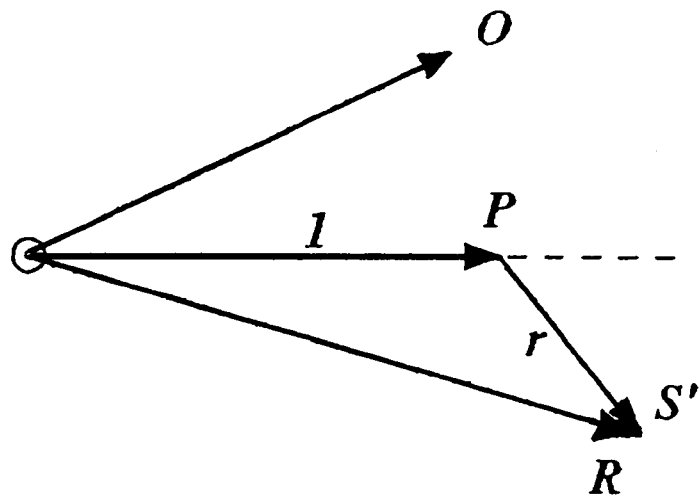

FIG. 1 shows an equivalent model for one stage of a PTRO, and a phasor diagram illustrating how the resultant stage input, R, is phase shifted with respect to the primary input signal, P, by mixing with the secondary input signal, S. In the phasor diagram the effect of adding the signal S with magnitude r to the signal P with magnitude 1 is illustrated.

Figure 2:
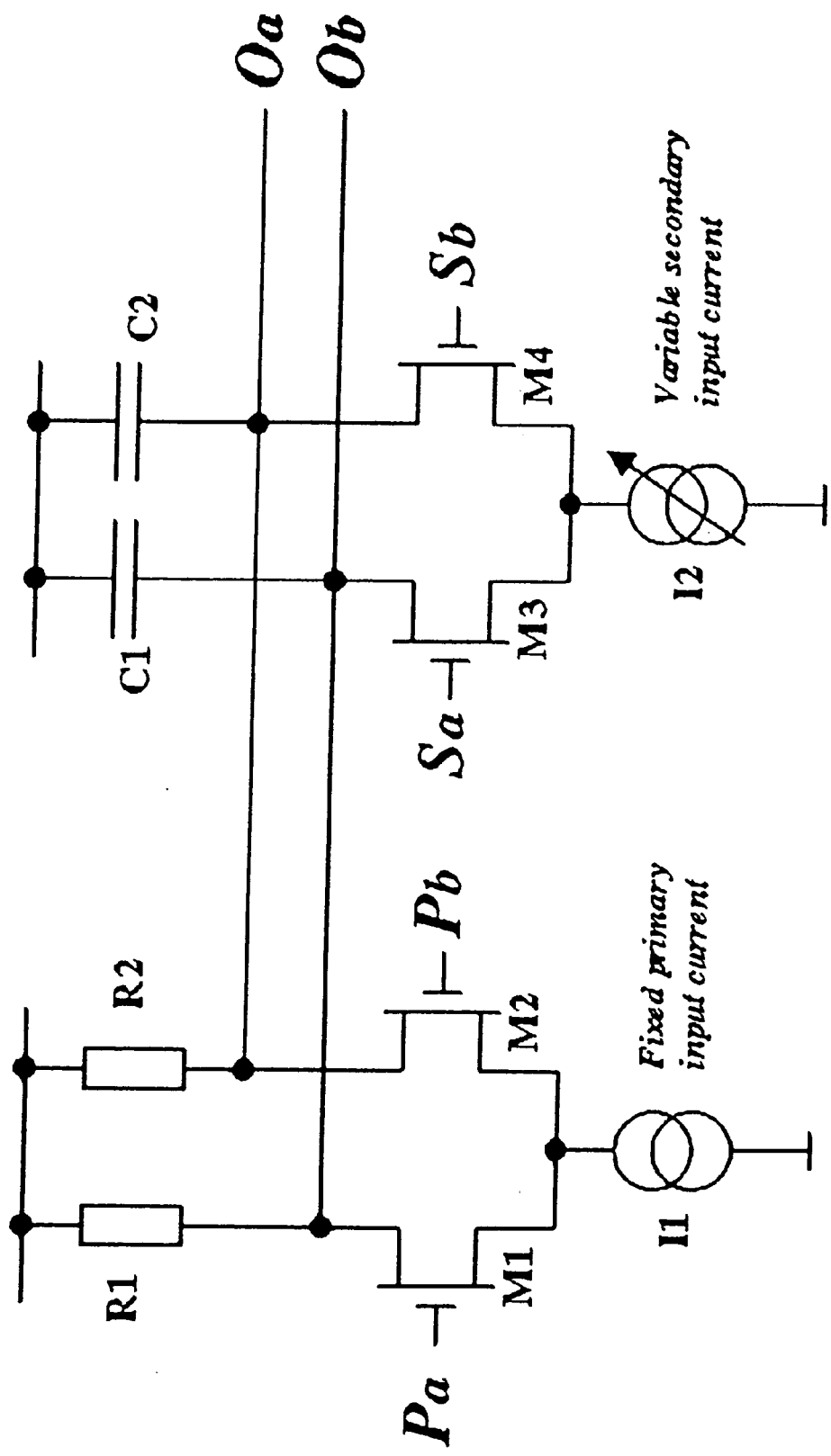
FIG. 2 illustrates the implementation of one stage of the preferred embodiment using MOS technology.

The basic PTRO stage design is shown in FIG. 2, implemented using a MOS technology. The circuit is based on a standard, non-inverting differential amplifier using a long-tailed pair M1, M2 with simple resistive loads R1, R2 operating on a fixed current source I1. This is driven by the differential primary stage input $P_a$, $P_b$. To implement phase-tuning, a second differential amplifier is added M3, M4 which is driven by the differential secondary stage input $S_a$, $S_b$. This second amplifier operates on a current source I2 whose value may be varied by some means in order to effect frequency tuning of the oscillator. The load capacitors C1, C2 are added in order to slow down the speed of the stage to set the desired ring oscillator frequency: these may optionally be omitted in order to achieve maximum possible operating frequency.

This circuit configuration effectively acts as a mixer: the currents generated by the two differential amplifiers are summed in the resistors, thereby developing an output voltage $O_a$, $O_b$ which represents the sum of the two amplifier outputs.

It will be appreciated that this circuit may easily be adapted to other technologies simply by substituting the MOS devices M1, M2, M3, M4 with other transistor types (e.g. bipolar).

The PTRO ring configuration is not fixed, but rather may be varied to suit a particular application. The parameters which define the ring configuration are listed below. These may each be independently chosen to alter the tuning characteristics of the complete oscillator.
1. Number of stages in the ring, N.
2. Stage offset between primary and secondary inputs, M.
3. Tuning polarity.

The values of M and N are subject to the following limits:
$N \geq 3$
$1 \leq M \leq (N-1)$ The tuning polarity may be either positive or negative.

Figure 3:
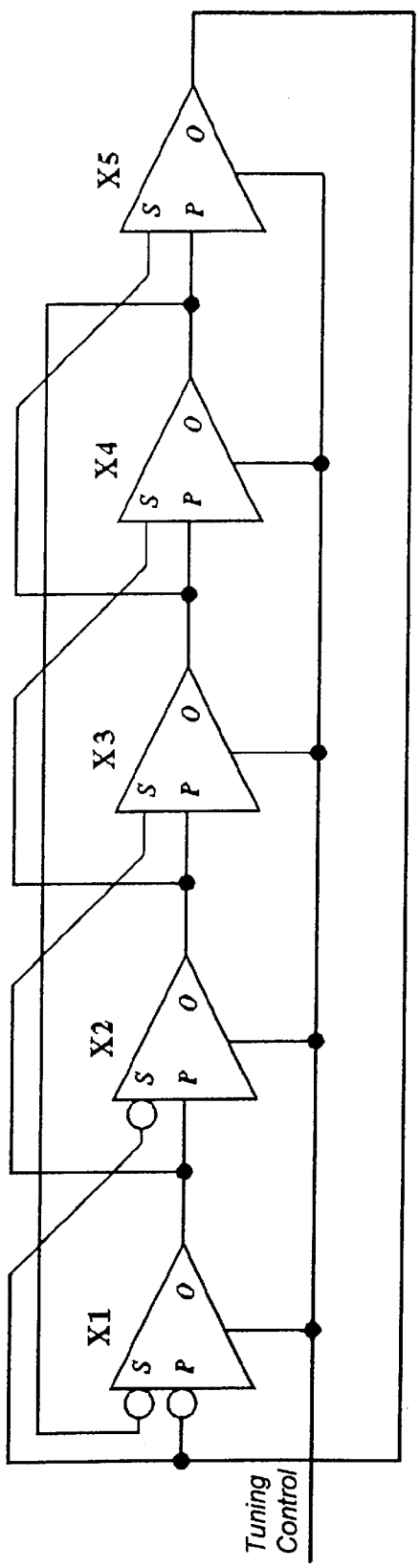
FIGS. 3 and 4 are examples of possible ring configurations.

The significance of these parameters is most easily understood by considering an example PTRO implementation, such as is shown in FIG. 3. This is a schematic diagram of a positively tuned 5-stage ring with a single stage offset between primary and secondary inputs (i.e N=5 and M=1). In the diagram, the differential signals are represented by single lines for simplicity. The circles on the inputs of the ring stages represent signal inversions which are simply achieved by interposing the two differential connections.

In the example shown, there are 5 stages in the ring (X1–5), with one inversion in the main loop via the 'P' inputs (on the 'P' input of X1) to promote oscillation as explained above. Additionally, each stage has a secondary input taken from one stage previous in the ring. Correct polarity around the loop is maintained by using appropriate inversions, in this case on the 'S' inputs of X1 and X2 corresponding to those 'S' inputs which bypass the inversion in the 'P' ring. Also shown is a Tuning Control signal which is applied to each stage of the ring to provide a means for adjusting the tuning current magnitude.

The most important parameter as far as tuning characteristics is concerned is M. The value of M should be chosen according to the degree of timing required: essentially the greater the value of M, the greater the degree of tuning. One way to understand this is to consider the secondary inputs to bypass part of the ring thereby reducing the loop delay and increasing frequency: the greater the number of stages bypassed, the larger the effect on tuning.

Figure 4:
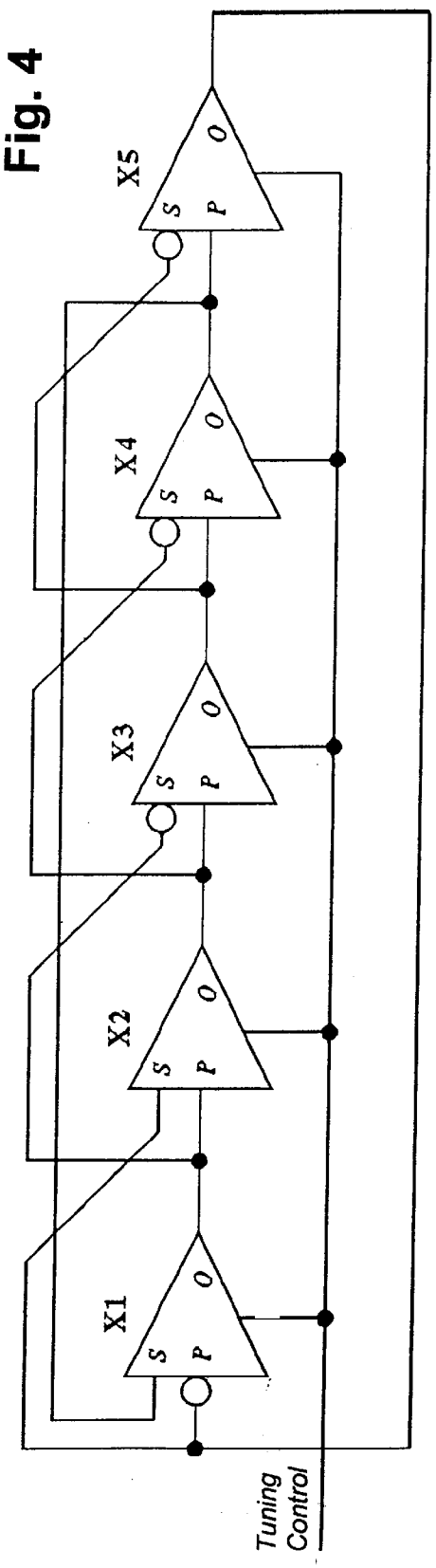

The tuning polarity determines the effect of tuning on the ring oscillator frequency: with positive tuning, the secondary input is applied with the same polarity as the primary input. This reinforces the primary input signal and causes the oscillation frequency to increase as the tuning current is increased. With negative tuning, the polarity of the secondary inputs is inverted compared to the primary input in each stage of the ring. This therefore means that the secondary input opposes the primary input signal and this results in a decrease in the oscillation frequency as the tuning current magnitude is increased. A negatively-tuned version of the FIG. 3 PTRO is shown in FIG. 4.

All of the ring parameters play an important role in determining the performance of any particular PTRO configuration. One configuration of special importance, is a positively tuned 6-stage ring oscillator with 2-stage secondary input feed forward (i.e. N=6, M=2), since his configuration displays particularly good tuning characteristics and stability.

Figure 5:
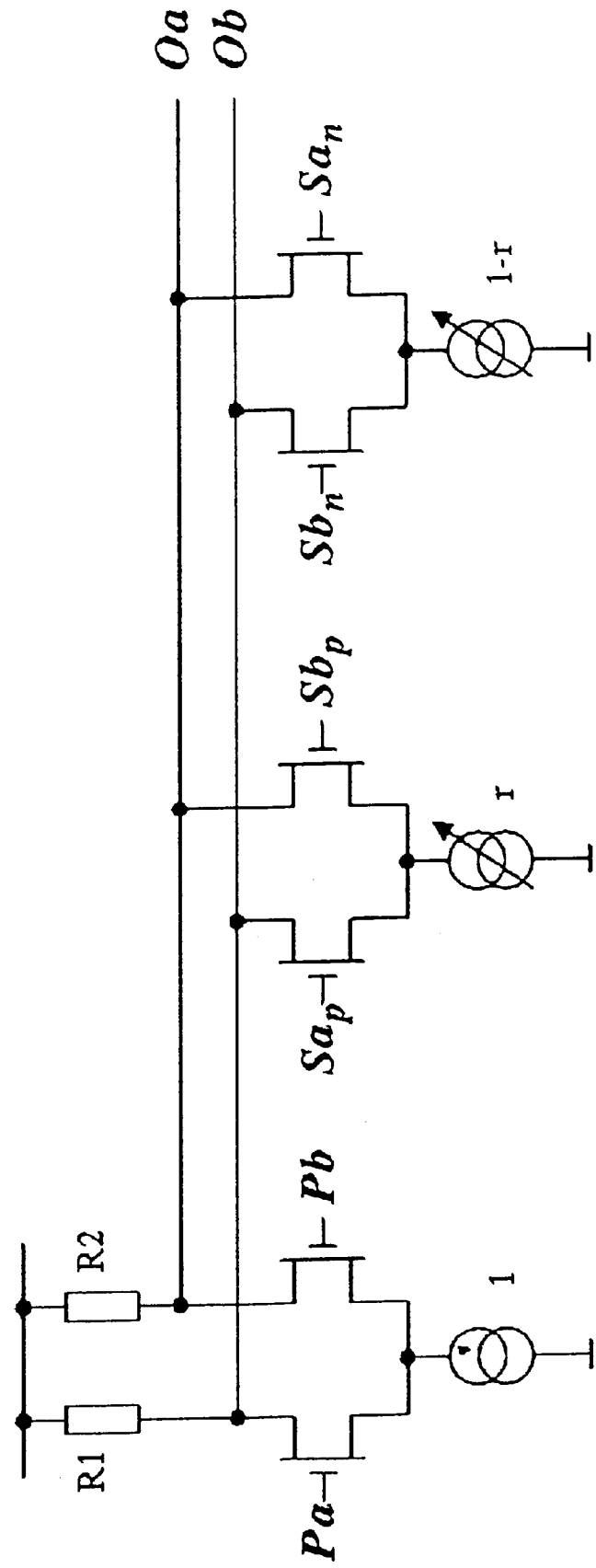
FIG. 5 is a diagrammatic representation of a stage in a further preferred embodiment which has positive and negative tuning.

There are several variations which can be made based on the above described circuits without departing from the essentials of this invention. Some of these are as follows:
Buffered Ring Stage The basic ring stage can be enhanced by the addition of a buffer (either a differential amplifier or a pair of source/emitter followers) on the output.
Differential Tuning The primary input amplifier current can be varied simultaneously and in the opposite sense of the secondary amplifier current (i.e. primary current is reduced as the secondary current is increased). This gives rise to a stronger degree of phase shifting (and hence greater frequency tuning sensitivity), but can cause instability of the oscillator (depending on the ring configuration).
Bipolar Tuning Both positive and negative tuning can be employed simultaneously (by the inclusion of two mixers) in order to implement an oscillator whose frequency can be both increased and decreased from the untuned frequency. This is shown in FIG. 5 below. In this design, the tuning current is divided between the two secondary stage inputs $S_p$, $S_n$ according to the value of r (which is consequently limited to the range 0–1). The secondary inputs, $S_p$ and $S_n$, are taken from $M_p$ and $M_n$ stages back in the loop respectively (these are not necessarily equal). Also, note that the polarity of $S_n$ has been reversed in order to effect negative tuning. With this arrangement, the zero tuning point occurs when the positive and negative tuning processes cancel each other out (at r=0.5 for equal $M_n$ and $M_p$ phase offsets).

In general tenris this invention is an oscillator that is comprised of a number of identical differential gain stages arranged in a ring, with an inversion in the loop to force oscillation. Each stage of the oscillator receives a primary input signal from the output of the previous ring stage, and also a secondary input signal taken from a number of stages previous in the ring. Each stage of the oscillator incorporates a mixer arrangement into which the primary and secondary signals are applied. The mixer incorporates some means for externally adjusting the relative weights of the primary and secondary signals being mixed. The function of the mixer is to produce a net signal whose phase is shifted from the primary signal. The effect of the phase shift is to produce a change in the frequency of the oscillation around the ring. By changing the weights of the signals being mixed, the degree of phase-shifting may be varied, and hence the oscillator frequency may be tuned.

The phase-tuned ring oscillator frequency may be tuned to a higher value than the equivalent untuned ring oscillator, which is not usually the case with conventional current-tuned ring oscillators. Also the frequency may be tuned both upwards and downwards from its nominal value by the same device, thereby allowing a large tuning range to be achieved.

We claim:

1. A tunable ring oscillator comprising a plurality of delay stages arranged in a ring in which each delay stage has input to it a primary input taken from the output of the previous stage and means arranged to cause an odd number of signal inversions around the ring thus formed wherein each delay stage has input to it a secondary input taken from the output of another stage a predetermined number of stages offset around the ring, and each delay stage further comprises mixing means arranged to mix said inputs in variable proportions whereby to vary the phase of the output of the delay stage relative to the phase of the primary input.

2. A tunable ring oscillator according to claim 1 in which said predetermined number is the same for all said delay stages.

3. A tunable ring oscillator according to claim 1 in which a variable control signal is applied to said mixing means of each delay stage to control said variable proportions.

4. A tunable ring oscillator according to claim 3 in which a single said control signal is applied to all of said means.

5. A tunable ring oscillator according to claim 1 in which for each delay stage, the secondary input has the same polarity as the primary input.

6. A tunable ring oscillator according to claim 1 in which, for each delay stage, the secondary input has the opposite polarity to that of the primary input.

7. A tunable ring oscillator comprising a plurality of delay stages arranged in a ring in which each delay has input to it a primary input taken from the output of the previous stage and means arranged to cause an odd number of signal inversions around the ring thus formed, wherein each delay stage has input to it a secondary input taken from the output of another stage a first predetermined number of stages offset around the ring and a tertiary input taken from the output of another stage a second predetermined number of stages offset around the ring, the tertiary input having a polarity opposite to that of the secondary input, and each delay stage further comprises mixing means arranged to mix said inputs in variable proportions whereby to vary the phase of the output of the delay stage relative to the phase of the primary input.

8. A tunable ring oscillator according to claim 7 in which said first and second predetermined numbers are the same.

9. A tunable ring oscillator according to claim 7 in which said first and second predetermined numbers are different.

10. A tunable ring oscillator according to claim 7, 8 or 9 in which said secondary and tertiary inputs are mixed with said primary input in complementary proportions.

* * * * *